United States Patent [19]

Amazawa et al.

[11] 4,216,430
[45] Aug. 5, 1980

[54] NOISE ELIMINATING CIRCUIT WITH AUTOMATIC GAIN CONTROL

[75] Inventors: Kiyoshi Amazawa; Masaharu Mori; Takashi Taniyama, all of Toda, Japan

[73] Assignee: Clarion Co., Ltd., Tokyo, Japan

[21] Appl. No.: 13,277

[22] Filed: Feb. 21, 1979

[30] Foreign Application Priority Data

Feb. 21, 1978 [JP] Japan .................................. 53-18768

[51] Int. Cl.$^2$ ............................................. H04B 1/10
[52] U.S. Cl. .................................... 455/219; 179/1 P; 455/222; 455/245; 455/312
[58] Field of Search ............... 325/348, 402, 403, 404, 325/408, 478, 456, 480, 411; 179/1 P, 1 VL

[56] References Cited
U.S. PATENT DOCUMENTS

| 3,036,211 | 5/1962 | Broadhead, Jr. et al. ............ 325/404 |
| 3,188,571 | 6/1965 | Michael ................................... 325/402 |
| 3,430,147 | 2/1969 | Hennessey et al. .................... 325/402 |
| 3,569,840 | 3/1971 | Tanaka ................................... 325/402 |

Primary Examiner—Robert L. Griffin
Assistant Examiner—Jin F. Ng
Attorney, Agent, or Firm—Blanchard, Flynn, Thiel, Boutell & Tanis

[57] ABSTRACT

A noise eliminating circuit for detecting and eliminating a noise pulse component included in an amplitude modulated wave, characterized by a circuit arrangement wherein an output of a detector circuit which is adapted to receive an input signal from an IF stage is coupled to an input of a band-pass filter through a noise amplifier; an output of said band-pass filter is coupled to an input of a pulse generator circuit; an output of said pulse generator circuit is connected to a gate circuit for stopping an audio AGC control operation and a gate circuit for eliminating a noise; an output of said noise amplifier is connected to an AGC control circuit through said gate circuit for stopping the audio AGC operation in order to apply an audio AGC control signal to said noise amplifier; and an output of said band-pass filter is connected to said AGC control circuit in order to apply a noise AGC to said noise amplifier; whereby said pulse generator circuit generates a pulse in response to the detection of the noise signal when the level of the noise signal outputted from the band-pass filter exceeds a given level to trigger said gate circuit for stopping the audio AGC operation and said gate for the noise elimination.

3 Claims, 2 Drawing Figures

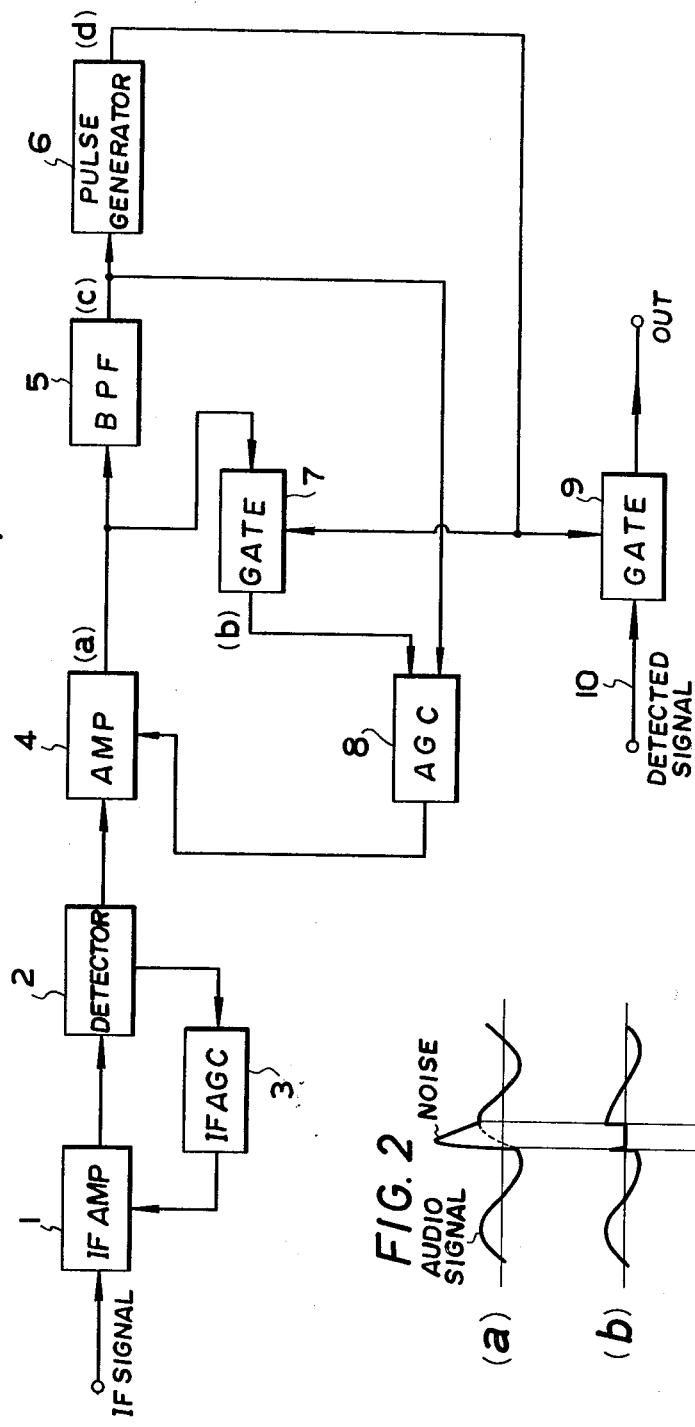

NOISE ELIMINATING CIRCUIT WITH AUTOMATIC GAIN CONTROL

BACKGROUND OF THE INVENTION

This invention generally relates to a noise eliminating circuit for an AM receiver, and more particularly to an improvement in a noise eliminating circuit of the type wherein a noise pulse component is detected from an input amplitude modulated wave and in response to the detected noise signal, a main signal path is opened for eliminating said noise component contained in the detected signal on said main signal path.

In a conventional noise eliminating system which is adapted to eliminate a noise pulse component by switching a main signal path for opening it, no problem is caused as far as relatively large noise pulse component appears in an audio signal, but if the appearing noise component is relatively small, there is caused a so-called reversing phenomenon, i.e., a phenomenon where the noise sounds louder than before switching of the main signal path for elimination of the noise component and a great distorsion is developed in the audio signal. It is therefore desired to effect said noise-eliminating switching in response preferentially to a noise component of such a high level that it causes no reversing phenomenon. However in the case where an audio signal exists, a relatively small noise component is not a serious matter to worry about as long as the reversing phenomenon can be avoided. If no audio signal exists, even such a relatively small noise component sounds too distinctively to be disregarded because it is not masked by the audio signal. As a consequence, it is difficult to prevent the phenomenon to a satisfactory extent. Conventional noise eliminating circuits have another disadvantage that in case a noise pulse enters the circuit successively in a relatively short period, the noise detecting function, and accordingly the operation of a pulse generator circuit are disabled, preventing the opening operation of the main signal path for the noise elimination.

SUMMARY OF THE INVENTION

It is therefore an object of the present invention to provide a noise eliminating circuit free from the disadvantages as involved in the conventional art and capable of effectively eliminating noise pulse components contained in an incoming amplitude modulated wave.

In accordance with the present invention, there is provided a noise eliminating circuit for a radio receiver having noise eliminating gate means comprising: detector means for detecting an audio signal from an incoming signal thereto; amplifier means for amplifying an output of said detector means; noise detector means for extracting a noise signal from an output of said amplifier means; signal producing means for providing a gate control signal to said noise eliminating gate means in response to said noise signal; AGC control gate means adapted to switch from on-state to off-state in response to said gate control signal; automatic gain control means for controlling the gain of said amplifier means in response to said output of the noise detector means and said output of amplifier means applied through said AGC control gate means thereto.

BRIEF DESCRIPTION OF THE DRAWINGS

FIG. 1 shows a block diagram of a noise eliminating circuit in accordance with the present invention.

FIG. 2 shows waveforms of an audio signal at various portions of the circuit shown in FIG. 1.

PREFERRED EMBODIMENT OF THE INVENTION

Referring now to the drawings, there is illustrated a preferred form of the noise eliminating circuit in accordance with the present invention.

FIG. 1 is a block diagram showing the arrangement of the noise eliminating circuit. An incoming signal of amplitude modulated wave obtained from an IF stage of an AM receiver is amplified at by IF amplifier 1 and then detected an an audio detector circuit 2. The output (audio signal) of the detector circuit 2 is coupled to an IF AGC circuit 3 for subjecting it to an IF AGC (automatic gain control) operation. The output of said detector circuit 2 is further coupled to an input of a noise extracting circuit such as a band-pass filter 5 through an amplifier 4. The output of said band-pass filter 5 is in turn connected to an input of a pulse generator circuit e.g. a Schmitt trigger circuit for generating a noise detected signal in the form of a pulse. The output of the amplifier 4 is connected to an AGC (automatic gain control) circuit 8 through a gate circuit 7 for the AGC control to subject said output to an audio AGC operation. The output of the band-pass filter 5 is also connected to the AGC circuit 8 for subjecting said output to a noise AGC operation. The output of the Schmitt trigger circuit 6 is coupled to a noise eliminating gate circuit 9 which is connected to said gate circuit 7 and the output of a detector circuit (not shown) of the main signal path. The gate circuits 7 and 9 are adapted to be triggered and thrown into an off state from an on state by the pulse signal from the Schmitt trigger circuit 6. Numeral 10 designates the main signal path of the AM receiver.

In the so constructed noise eliminating circuit, the amplifier 4 is adapted to receive two AGC signals, i.e., noise AGC and audio AGC control signals. The noise AGC signal is applied so that only with continuous inputting of a relatively large noise component will the amplifier 4 produce a signal of sufficient magnitude to trigger the Schmitt trigger circuit 6 to generate a noise-eliminating gate control pulse to avoid the situation such that the Schmitt trigger circuit 6 remains off and fails to generate the pulse. The audio AGC signal is applied in order to decrease the gain of the amplifier 4 and prevents the amplifier 4 producing a Schmitt trigger operating signal which would open the IF stage and produce a reversing phenomenon when appreciable audio signal exists. In other words, the output of the amplifier 4 is controlled by the audio AGC signal, the output of the band-pass filter 5 is controlled by the noise AGC signal, and the operation level of the Schmitt trigger circuit 6 is so set that the Schmitt trigger circuit 6 generates a pulse only when the noise signal level obtained from said band-pass filter exceeds a predetermined level, or even when said noise signal level is low in the absence of an audio signal where no reversing phenomenon occurs.

Therefore, if an audio input signal containing a pulsed noise component enters this circuit, a noise component of a certain level after subjected to the audio AGC and noise AGC control operations as described is outputted from the band-pass filter 5. If the level of the noise signal does not exceed the predetermined level, that is, if the level of the input noise signal is so low as to cause a reversing phenomenon in the presence of an audio signal, the Schmitt trigger circuit 6 does not actuate to generate a pulse. The gate circuit 7 is then kept in its ON state and the audio AGC control operation is maintained. If, on the other hand, the level of the noise signal extracted from the band-pass filter 5 exceeds the predetermined level, that is, if the level of the input noise signal is too large to cause a reversing phenomenon, with or without an audio signal, the Schmitt trigger circuit 6 generates a pulse signal that triggers the gate circuit 9 to eliminate the noise component contained in the detection signal of the main signal path 10. The pulse signal is also applied to the gate circuit 7 to turn it off, which stops the operation of the audio AGC by blocking subsequent audio signals containing a noise component.

On the other hand, if no audio signal exists and only a pulsed noise component enters the circuit, a low noise signal level is more greatly amplified by the band-pass filter 5, and it causes the Schmitt trigger circuit 6 to generate a pulse for triggering the gate circuit 9 as mentioned above to eliminate a noise component in the main signal path 10. At the same time, the latter pulse triggers the gate circuit 7 in order that a subsequent noise component may not actuate the function of audio AGC.

FIG. 2 is a waveform diagram of an audio signal containing a relatively large noise component taken at various portions of the circuit as shown in FIG. 1. (a) indicates an output signal of the amplifier 4, (b) an output signal of the gate circuit 7, (c) an output signal of the band-pass filter 5 and (d) an output signal of the Schmitt trigger circuit 6.

As mentioned in detail above, in accordance with the present invention, prevention of a reversing phenomenon as well as a noise elimination can be attained because, if an audio signal exists, the circuit of the present invention detects and eliminates only a pulsed noise signal of such a level that no reversing phenomenon is caused, and if no audio signal exists, it can even detect a noise signal of an extremely low level.

What is claimed is:

1. A noise eliminating circuit for a radio receiver having noise eliminating gate means comprising:
   detector means for detecting an audio signal from an incoming signal thereto;
   amplifier means for amplifying an output of said detector means corresponding to said audio signal;
   noise detector means for extracting a noise signal from the output of said amplifier means;
   signal producing means for providing a gate control signal to said noise eliminating gate means in response to said noise signal;
   automatic gain control means for controlling the gain of said amplifier means;
   AGC control gate means adapted to switch from an on-state to an off-state in response to said gate control signal, said said AGC control gate means applying the output of said amplifier means to said automatic gain control means during the on-state;
   said automatic gain control means providing noise gain control of said amplifier means in response to said noise signal from said noise detector means and providing audio gain control of said amplifier means in response to said output of said amplifier means applied through said AGC control gate means.

2. A noise eliminating circuit according to claim 1 wherein said noise detector means includes a band-pass filter.

3. A noise eliminating circuit according to claim 1 wherein said signal producing means includes a Schmitt trigger circuit set to produce a pulse for triggering both the gate means when the level of said noise is greater than that of an operating level of said Schmitt trigger circuit.

* * * * *